(12) United States Patent
Kronholz et al.

(10) Patent No.: US 8,338,892 B2
(45) Date of Patent: Dec. 25, 2012

(54) STRAIN ENHANCEMENT IN TRANSISTORS COMPRISING AN EMBEDDED STRAIN-INDUCING SEMICONDUCTOR ALLOY BY CORNER ROUNDING AT THE TOP OF THE GATE ELECTRODE

(75) Inventors: Stephan Kronholz, Dresden (DE); Roman Boschke, Dresden (DE); Maciej Wiatr, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 293 days.

(21) Appl. No.: 12/893,808

(22) Filed: Sep. 29, 2010

(65) Prior Publication Data
US 2011/0101469 A1 May 5, 2011

(30) Foreign Application Priority Data

Oct. 30, 2009 (DE) .................. 10 2009 046 241

(51) Int. Cl.
*H01L 29/78* (2006.01)
*H01L 21/8234* (2006.01)
*H01L 21/8238* (2006.01)
(52) U.S. Cl. ... 257/368; 257/384; 257/402; 257/E27.06; 257/E27.062; 257/E21.616; 257/E21.621
(58) Field of Classification Search .............. 438/197, 438/199, 230, 304; 257/368, 384, 402, E27.06, 257/E27.062, E21.616, E21.621
See application file for complete search history.

(56) References Cited

U.S. PATENT DOCUMENTS

| 6,872,626 | B1 | | 3/2005 | Cheng | |
|---|---|---|---|---|---|
| 7,084,025 | B2 | | 8/2006 | Phua et al. | |
| 7,110,999 | B2 | * | 9/2006 | Colby et al. | 707/802 |
| 7,164,163 | B2 | * | 1/2007 | Chen et al. | 257/288 |
| 7,335,545 | B2 | * | 2/2008 | Currie | 438/197 |
| 7,394,136 | B2 | * | 7/2008 | Ke et al. | 257/374 |
| 7,416,949 | B1 | * | 8/2008 | Pas et al. | 438/275 |
| 7,429,775 | B1 | * | 9/2008 | Nayak et al. | 257/369 |
| 7,462,915 | B2 | * | 12/2008 | Yang et al. | 257/369 |
| 7,579,262 | B2 | * | 8/2009 | Hoentschel et al. | 438/478 |
| 7,670,923 | B1 | * | 3/2010 | Nayak et al. | 438/413 |
| 7,709,312 | B2 | * | 5/2010 | Jin et al. | 438/197 |
| 7,719,060 | B2 | * | 5/2010 | Wei et al. | 257/368 |
| 7,741,167 | B2 | * | 6/2010 | Beyer et al. | 438/199 |
| 7,893,503 | B2 | * | 2/2011 | Beyer et al. | 257/369 |

(Continued)

OTHER PUBLICATIONS

Wikipedia, Thermische Oxidation von Silizium, Oct. 24, 2011, URL: http://de.wikipedia.org/wiki/Thermische_Oxidation_von_Silizium, retrieved on Nov. 28, 2011.

(Continued)

*Primary Examiner* — Evan Pert
(74) *Attorney, Agent, or Firm* — Williams, Morgan & Amerson, P.C.

(57) ABSTRACT

In MOS transistor elements, a strain-inducing semiconductor alloy may be embedded in the active region with a reduced offset from the channel region by applying a spacer structure of reduced width. In order to reduce the probability of creating semiconductor residues at the top area of the gate electrode structure, a certain degree of corner rounding of the semiconductor material may be introduced, which may be accomplished by ion implantation prior to epitaxially growing the strain-inducing semiconductor material. This concept may be advantageously combined with the provision of sophisticated high-k metal gate electrodes that are provided in an early manufacturing stage.

20 Claims, 5 Drawing Sheets

U.S. PATENT DOCUMENTS

| | | | |
|---|---|---|---|
| 7,897,493 B2 * | 3/2011 | Fiorenza et al. | 438/486 |
| 8,106,467 B2 * | 1/2012 | Shima | 257/410 |
| 8,124,473 B2 * | 2/2012 | Pan et al. | 438/233 |
| 8,202,777 B2 * | 6/2012 | Kronholz et al. | 438/230 |
| 8,247,285 B2 * | 8/2012 | Lin et al. | 438/216 |
| 2007/0287244 A1 | 12/2007 | Shen et al. | |
| 2008/0191243 A1 | 8/2008 | Liu et al. | |
| 2009/0085075 A1 | 4/2009 | Kim et al. | |

OTHER PUBLICATIONS

Translation of Official Communication from German Patent Application No. 10 2009 046 241.4 dated Nov. 29, 2011.

* cited by examiner

STRAIN ENHANCEMENT IN TRANSISTORS COMPRISING AN EMBEDDED STRAIN-INDUCING SEMICONDUCTOR ALLOY BY CORNER ROUNDING AT THE TOP OF THE GATE ELECTRODE

BACKGROUND OF THE INVENTION

1. Field of the Invention

Generally, the present disclosure relates to the fabrication of highly sophisticated integrated circuits including advanced transistor elements that comprise strain-inducing semiconductor alloys.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity which in turn causes an increase of gate resistivity due to the reduced dimensions, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a strong dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although usage of high speed transistor elements having an extremely short channel may be restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may not be compatible with requirements for many types of circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain component in the channel region of the transistor elements, the charge-carrier mobility and thus the overall conductivity of the channel may be enhanced. For a silicon material having a standard crystallographic configuration, i.e., a (100) surface orientation with the channel length direction oriented along a <110> equivalent direction, the creation of a tensile strain component in the current flow direction may enhance conductivity of electrons, thereby improving transistor performance of N-channel transistors. On the other hand, generating a compressive strain component in the current flow direction may increase hole mobility and thus provide superior conductivity in P-channel transistors. Consequently, a plurality of strain-inducing mechanisms have been developed in the past which may per se require a complex manufacturing sequence for implementing the various strain-inducing techniques. For example, one promising approach that is frequently applied is the incorporation of a compressive strain-inducing silicon/germanium alloy in the drain and source areas of P-channel transistors. For this purpose, in an early manufacturing stage, cavities are formed selectively adjacent to the gate electrode structure of the P-channel transistor, while the N-channel transistors are covered by a spacer layer. Additionally, the gate electrode of the P-channel transistor has to be encapsulated in order to not unduly expose the gate electrode material to the etch ambient for forming the cavities and also for providing an efficient growth mask during the selective epitaxial growth process, in which the silicon/germanium alloy may be grown on a crystalline substrate material, while a significant deposition of the alloy on dielectric surface areas may be suppressed by appropriately selecting the corresponding process parameters.

A strain-inducing mechanism as described above is a very efficient concept for improving the transistor performance, at least for P-channel transistors, since, for a given gate length, an increased current drive capability may be achieved. The finally obtained strain component in the channel region significantly depends on the internal strain level of the silicon/germanium material, which in turn strongly depends on the lattice mismatch between the silicon/germanium alloy, i.e., its natural lattice constant, and the remaining template material of the silicon-based active region. Frequently, a desired increase of the germanium concentration in view of increasing the lattice mismatch may be associated with significant technological problems in view of germanium agglomeration and the creation of significant lattice irregularities so that germanium concentration levels of above 30 atomic percent are difficult to achieve on the basis of presently available selective epitaxial growth techniques. In addition to the germanium concentration, the effective offset of the strained silicon/germanium alloy from the channel region also strongly influences the finally achieved strain level in the channel region. Consequently, it is attempted to reduce the lateral offset of a corresponding cavity and thus of the resulting silicon/germanium alloy with respect to the channel region by reducing a width of spacer elements, which are typically used as a mask material during the above-described process sequence for forming the silicon/germanium alloy. Although reducing the lateral offset is considered an efficient mechanism for adjusting a desired high strain level, applying a spacer width of approximately 8 nm or less may result in significant yield losses, in particular when, additionally, sophisticated gate dielectric materials may be incorporated into the gate electrode structure. That is, frequently, the high-k dielectric material in combination with the work function adjusting metal species may be provided in an early manufacturing stage in order to enable the further processing on the basis of well-established electrode materials, such as silicon, silicon/germanium and the like. Consequently, the corresponding sidewall spacer may have to confine the sensitive materials and also the semiconductor electrode material, in particular during the selective epitaxial growth process. Upon reducing the width of the sidewall spacer element, irregularities of the upper edge of the gate electrode structures of the P-channel transistors have been observed, as will be explained in more detail with reference to FIGS. 1a and 1b.

FIG. 1a schematically illustrates a cross-sectional view of a semiconductor device 100 comprising a substrate 101 in combination with a silicon-based semiconductor layer 102. As is well known, the semiconductor layer 102 comprises a plurality of active regions, such as active regions 102A, 102B, which are to be understood as semiconductor regions in and above which transistor elements are to be formed, such as transistors 150A, 150B. It should be appreciated that the active regions 102A, 102B are laterally delineated by isolation structures (not shown), such as shallow trench isolations and the like. Moreover, in the vertical direction, the active regions 102A, 102B may be delineated by a buried insulating material (not shown), if a silicon-on-insulator (SOI) configuration is considered, while, in other cases, counter-doped areas may be formed around the respective active regions 102A, 102B in a crystalline material of the substrate 101, thereby implementing a "bulk" configuration. In the example shown, the transistor 150A may represent a P-channel transistor, which is to receive a compressive strain-inducing silicon/germanium alloy, as discussed above. On the other hand, the transistor 150B represents an N-channel transistor, which may not receive a strain-inducing semiconductor alloy and which has at least to be protected during the corresponding sequence for providing a silicon/germanium alloy in the transistor 150A.

In the manufacturing stage shown in FIG. 1a, the transistor 150A comprises a gate electrode structure 160A comprising a gate dielectric material 161, which may comprise a high-k dielectric material, such as hafnium oxide-based materials and the like. Furthermore, in this case, a conductive cap layer 162, which may also comprise a work function adjusting metal species, is formed above the material 161. Additionally, a silicon material, such as a polycrystalline silicon material 163, is provided above the layer 162 and may also be referred to as an electrode material, although it should be noted that the material 162 may also act as an electrode material. Furthermore, a dielectric cap layer 164, for instance a silicon nitride material, is provided on top of the silicon material 163. Furthermore, a spacer element 166S may be formed in combination with a silicon oxide liner 165, at least on a portion of the sidewalls of the gate electrode structure 160A. As previously discussed, at least the spacer element 166S is to confine the sensitive materials 161, 162 and also has to protect integrity of the material 163, which in turn is protected by the oxidized portion 165. A gate electrode structure 160B of the transistor 150B comprises the materials 161 and 162, which may have a different composition compared to the material 162 of the gate electrode structure 160A, for instance, with respect to a work function adjusting species and the like. Moreover, the material 163 may have formed thereon the oxidized portion 165, while a spacer layer 166 may cover the gate electrode structure 160B and the active region 102B. Moreover, an oxide layer 165, which may be formed together with the oxide liner 165 and the materials 163, may be positioned between the active region 102B and the spacer layer 166.

As previously discussed, a thickness of the spacer layer 166 is desirably selected as thin as possible so as to obtain the spacer elements 166S in the transistor 150A with a minimum width in order to reduce an offset of cavities 151 to be formed in the active region 102A. On the other hand, a sufficient degree of material confinement has to be ensured by the spacer element 166S, which may, however, be increasingly compromised upon further reducing the thickness of the spacer layer 166 and thus of the width of the spacers 166S.

Typically, the semiconductor device 100 as illustrated in FIG. 1a is formed on the basis of the following processes. After providing corresponding isolation structures (not shown), the basic dopant concentration in the active regions 102A, 102B is established. Thereafter, appropriate materials for the gate dielectric material 161 and the cap layers 162 may be provided, possibly in combination with a corresponding patterning regime, so as to provide different metal-containing material systems for the transistors 150A, 150B in order to adjust the appropriate work function for the transistors 150A, 150B. It should be noted that, if required, an additional threshold adjusting semiconductor material may be provided in one of the active regions 102A, 102B, for instance on the basis of epitaxial growth techniques in order to enable a desired adjustment of the work function for available metal species that are typically used for adjusting the work function of P-channel transistors and N-channel transistors, respectively. For example, a silicon/germanium alloy may be selectively formed on the active region 102A prior to forming the gate electrode structures 160A, 160B. Thereafter, the silicon material 163 may be deposited in combination with a dielectric cap layer 164 and with additional materials, such as anti-reflective coating (ARC) materials, hard mask materials and the like, as are required for performing sophisticated lithography and etch processes to obtain the gate electrode structures 160A, 160B with critical dimensions of 50 nm and less. After the patterning sequence, the spacer layer 166 is deposited, preceded by an oxidation process for forming the oxide liners 165. For example, a typical oxide thickness may be in the range of 2 nm, while the spacer layer 166 may be deposited with a thickness of approximately 10 nm. It should be appreciated that, if required, a silicon nitride liner material may be deposited, for instance, as a part of the spacer layer 166 if an enhanced density material may be required which may be accomplished on the basis of thermally activated chemical vapor deposition (CVD) techniques and the like. Next, a resist mask 103 is provided to cover the transistor 150B while exposing the transistor 150A to an etch ambient 104 in which the spacer layer 166 may be etched so as to obtain the spacer element 166S. Since a plasma assisted silicon nitride etch process may have a lateral etch component, the initial thickness of the spacer layer 166 may be reduced, thereby resulting in spacer elements having a width of approximately 8 nm or less, which would be desirable in view of reducing the offset of the cavities 151 with respect to a channel region 152. Thereafter, the etch chemistry may be changed so as to etch into the silicon material of the active region 102A, while using the spacer element 166S and the cap layer 164 as an etch stop material. It should be appreciated that this etch phase may also include an etch step for removing oxide materials, which may still be formed on the active region 102A due to the preceding oxidation process. Consequently, upon selecting a reduced initial width of the spacer layer 166, there is a certain risk of exposing the oxide liner 165 at a top corner 160T (FIG. 1b), which may thus be attacked during the corresponding etch step.

After forming the cavities 151, the resist mask 103, if still provided, may be removed and appropriate cleaning processes are performed, for instance, based on diluted hydrofluoric acid (HF), which is known to efficiently remove contaminants, etch byproducts and silicon oxide materials. Thus, any exposed areas of the oxide liner 165 may be further attacked so that even the material 163 may be locally exposed during the corresponding process sequence. Furthermore, prior to the actual selective epitaxial growth process, a further cleaning process may be performed, which may also result in an additional exposure of material 163 at the top corner 160T.

FIG. 1b schematically illustrates the semiconductor device 100 when exposed to a selective epitaxial growth process 105, in which a silicon/germanium material 153 is grown in the cavities 151 (FIG. 1a), while the spacer layer 166 acts as a growth mask for the transistor 150B. On the other hand, the spacer 166S in combination with the cap layer 164 have to provide integrity of the electrode material 163 whose integrity, however, may have been compromised during the preceding process, in particular at the top area 160T, as discussed above. Thus, during the selective epitaxial growth process 105, silicon/germanium material residues 153R may form at the top corner 160T, wherein the size of these residues 153R may depend on the degree of exposure of the material 163, which in turn strongly depends on the initial thickness of the layer 166 and thus of the width of the spacers 166S.

During the further processing, respective spacers 166S may also be formed on the gate electrode structure 160B while masking the transistor 150A, and the spacers 166S may be used, possibly in combination with additional spacer elements, as an implantation mask for forming drain and source extension regions by ion implantation. In other cases, the spacer layer 166, the spacers 166S and the dielectric cap material 164 may be removed and the further processing may be continued by forming appropriate offset spacer elements for the subsequent incorporation of dopant species for providing the drain and source extension regions. In any case, the material residues 153R may significantly influence the subsequent processing, for instance resulting in an increased shadowing effect for subsequent implantation processes or spacer forming processes and the like. Furthermore, at a very advanced manufacturing stage, metal silicide regions may have to be formed in the active regions 102A, 102B and also in the material 163 of the gate electrode structures 160A, 160B, wherein the residues 153R may further negatively affect the silicidation process and may thus result in significant modifications of the overall transistor characteristics.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the strain-inducing effect of an embedded strain-inducing semiconductor alloy in the active region of sophisticated transistors may be increased by reducing the lateral offset of the strain-inducing semiconductor material from the channel region. This may be accomplished by using a reduced spacer width substantially without compromising integrity of the silicon-based electrode material at a top corner of the gate electrode structure. The increased integrity of this sensitive device area may be preserved by generating a certain degree of "corner rounding" of the silicon-based gate electrode material, which may be accomplished by locally modifying the etch rate and/or the electrode material in this critical area. For instance, by modifying the etch behavior, a certain degree of corner rounding may be achieved during the complex patterning process, which may, therefore, significantly reduce the probability of exposing the sensitive corner area prior to performing a selective epitaxial growth process. In addition to or alternatively to modifying the etch rate, the oxidation behavior may also be modified, i.e., increased at the corner area, so that a corresponding oxide liner material may have an increased thickness in the sensitive corner area. Consequently, the probability of growing material residues at the corner area of the sophisticated gate electrode structures, in particular at the corner of gate electrode structures of P-channel transistors, may be significantly reduced.

One illustrative method disclosed herein comprises forming a gate electrode structure above a semiconductor region. The gate electrode structure comprises a gate dielectric material, a semiconductor material formed above the gate dielectric material and a dielectric cap material that is formed above the semiconductor material. The method further comprises performing an oxidation process to form an oxide liner on sidewalls of the semiconductor material, wherein a thickness of the oxide liner is greatest at an interface formed between the semiconductor material and the dielectric cap layer. The method additionally comprises forming a spacer on sidewalls of the gate electrode structure and forming cavities in the semiconductor region by using the dielectric cap layer and the spacer as an etch mask. Furthermore, the method comprises forming a strain-inducing semiconductor material in the cavities by using the dielectric cap layer and the spacer as a growth mask.

A further illustrative method disclosed herein comprises forming a gate layer stack above a first semiconductor region and a second semiconductor region. The method further comprises patterning the gate layer stack to form a first gate electrode structure above the first semiconductor region and forming a second gate electrode structure above the second semiconductor region, wherein the first and second gate electrode structures comprise a semiconductor material. Additionally, the method comprises modifying an oxidation behavior of the semiconductor material of the first gate electrode structure. Moreover, an oxidation process is performed to form an oxide on sidewalls of the semiconductor material of the first and second gate electrode structures. Additionally, a spacer layer is formed above the first and second gate electrode structures and a spacer element is formed on the sidewalls of the first gate electrode structure on the basis of the spacer layer. Additionally, the method comprises forming a strain-inducing semiconductor alloy in the first semiconductor region by using the spacer element as a mask.

One illustrative semiconductor device disclosed herein comprises a gate electrode structure of a transistor that is formed above a semiconductor region and comprises a silicon-containing electrode material formed above a gate insulation layer, which in turn comprises a high-k dielectric material. The silicon-containing electrode material has sidewalls, and a silicon oxide material is formed on the sidewalls, wherein a thickness of the silicon oxide material at a top of the silicon-containing electrode material is greater than a thickness at a bottom of the silicon-containing electrode material. The semiconductor device further comprises a strain-inducing semiconductor alloy formed in the semiconductor region. Additionally, drain and source regions are formed at least partially in the strain-inducing semiconductor alloy.

BRIEF DESCRIPTION OF THE DRAWINGS

The disclosure may be understood by reference to the following description taken in conjunction with the accompanying drawings, in which like reference numerals identify like elements, and in which.

Figure 1A:
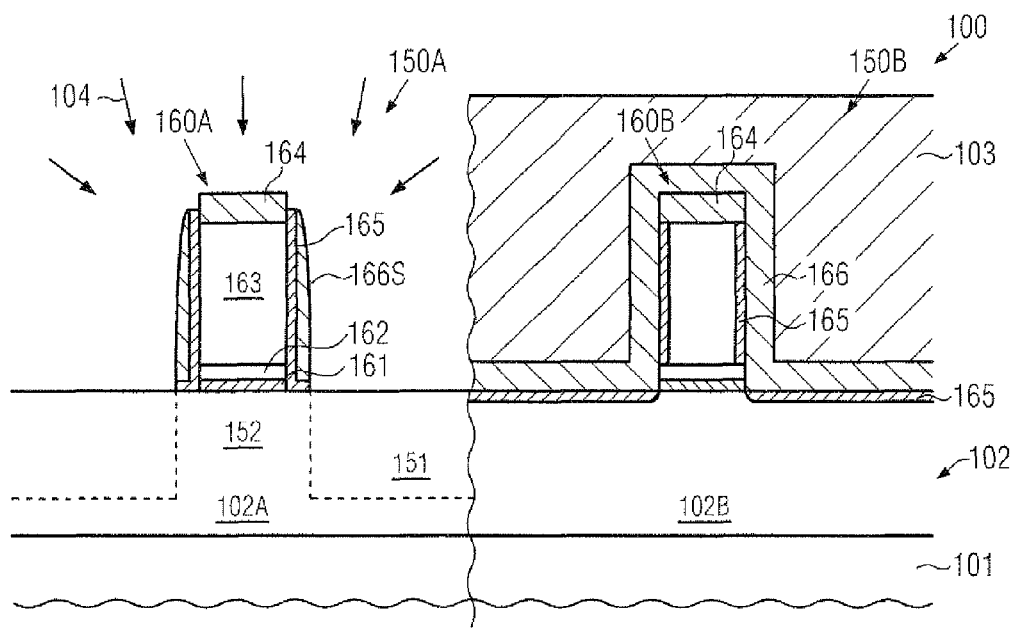
FIGS. 1a-1b schematically illustrate cross-sectional views of a conventional semiconductor device during various manufacturing stages in forming a strain-inducing silicon/germanium alloy selectively in P-channel transistors on the basis of a sidewall spacer having a reduced thickness.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The principles disclosed herein provide semiconductor devices and manufacturing techniques in which a reduction of the thickness of a spacer layer and thus of the width of the resulting spacer elements used as etch and growth masks during the implementation of a strain-inducing semiconductor alloy may be accomplished without contributing to an increased probability of creating undesired material residues at the top corners of the gate electrode structures. For this purpose, the semiconductor-based electrode material of at least one type of gate electrode structure may receive a certain degree of "corner rounding" at the top area, thereby reducing the probability of exposing the electrode material in these sensitive areas. The corner rounding may be achieved by locally modifying the etch and/or oxidation behavior of the semiconductor-based electrode material so that, upon patterning the electrode material and/or upon forming an oxide liner, the superior configuration at the top region may be accomplished. In some illustrative embodiments, the modification of the etch and/or oxidation behavior may be accomplished by incorporating any appropriate species, such as dopants and the like, on the basis of an ion implantation process with an appropriate implant energy. In other cases, other treatments, such as electron bombardment, may be used in order to obtain an efficient modification of the material characteristics at or near the surface of the semiconductor-based electrode material. In some illustrative embodiments, the local modification of the semiconductor-based electrode material may be performed in one type of transistor only, thereby maintaining a high degree of compatibility with conventional process strategies. Based on the principles disclosed herein, superior transistor performance may be obtained for transistor elements having a gate length of 50 nm and less. Furthermore, the concepts disclosed herein may be advantageously combined with sophisticated gate electrode structures including high-k dielectric materials in combination with electrode metals, wherein the semiconductor-based electrode material may be maintained and may be partially converted into a metal silicide in a very advanced manufacturing stage. Thus, in such sophisticated applications, any unwanted semiconductor residues at the top area of the gate electrode structure may be substantially avoided, thereby not unduly affecting the overall gate characteristics, for instance when providing a metal silicide therein, which may conventionally result in a significant risk of increased leakage currents, in particular in device areas with closely spaced gate electrode structures, due to an increase of the effective "gate length" at the top areas of the gate electrode structures due to the presence of any semiconductor material residues. Consequently, sophisticated patterning strategies may be implemented on the basis of a reduced thickness of the sidewall spacers that provide gate electrode integrity during the formation of an embedded semiconductor alloy, wherein the basic characteristics of the gate electrode structure, such as work function and the like, may be adjusted in an early manufacturing stage.

Figure 1B:
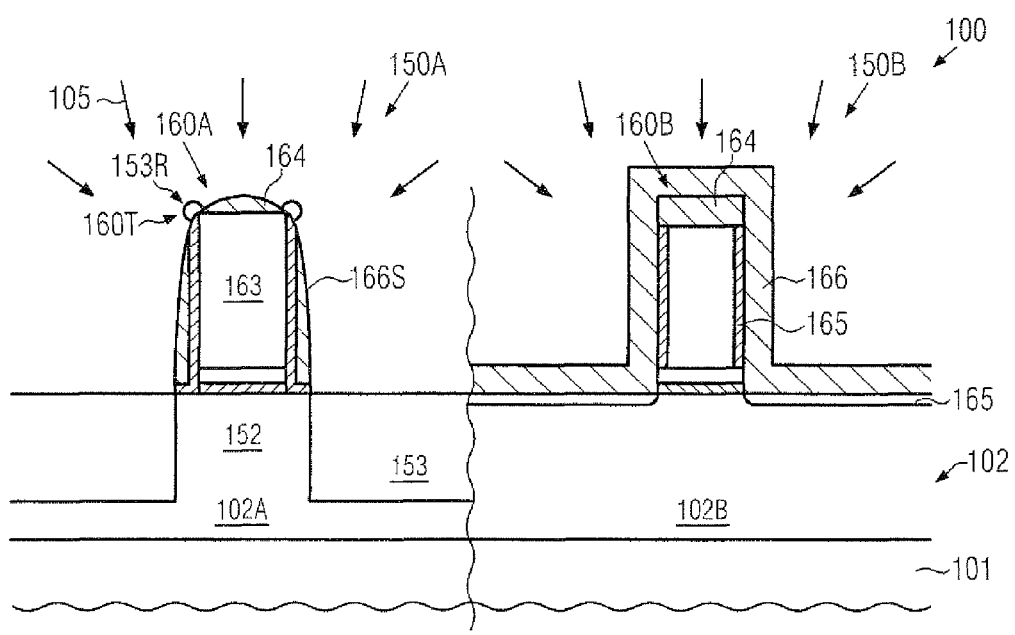

With reference to FIGS. 2a-2h, further illustrative embodiments will now be described in more detail, wherein reference may also be made to FIGS. 1a-1b, if appropriate.

Figure 2A:
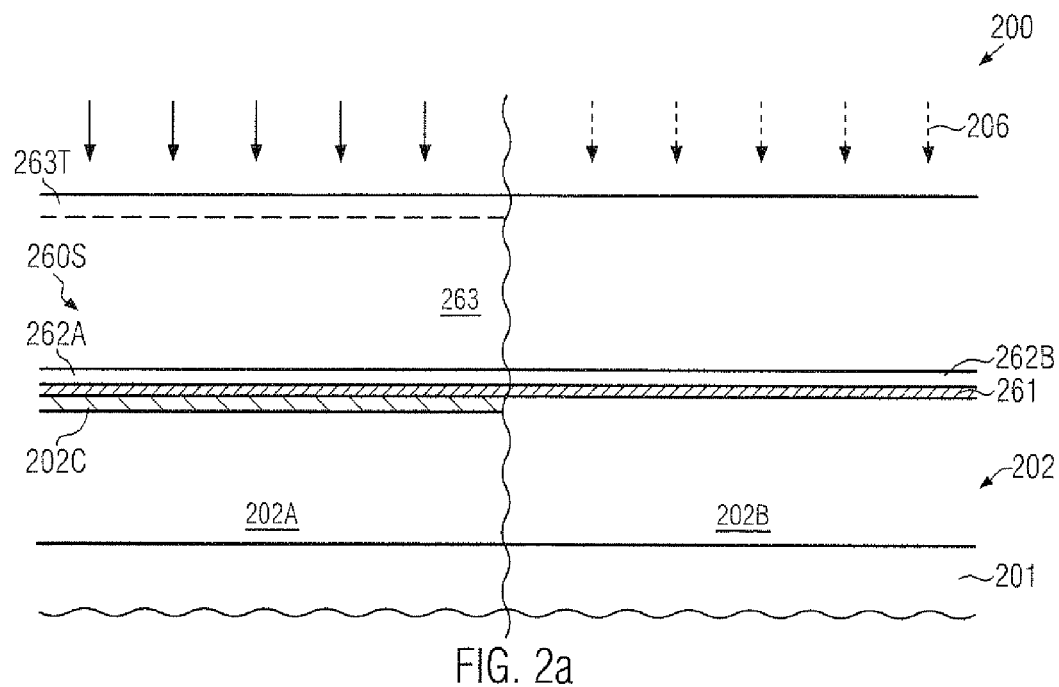
FIGS. 2a-2b schematically illustrate cross-sectional views of a semiconductor device in an early manufacturing stage in which a surface portion of a semiconductor-based electrode material is modified so as to obtain a modified etch and/or oxidation behavior during the subsequent patterning of gate electrode structures, according to illustrative embodiments.

FIG. 2a schematically illustrates a semiconductor device 200 in an early manufacturing stage. The semiconductor device 200 may comprise a substrate 201 in combination with a semiconductor layer 202, which may comprise a first semiconductor region 202A, which may also be referred to as an active region, and a second semiconductor region 202B. With respect to the semiconductor layer 202 and the substrate 201, the same criteria may apply as previously discussed with reference to the semiconductor device 100. Furthermore, any isolation structures (not shown) may be formed in the semiconductor layer 202 so as to laterally define the active regions 202A, 202B. In some illustrative embodiments, the active region 202A may comprise an additional semiconductor material 202C having an appropriate thickness and composition to enable a desired band gap offset in view of work function species to be provided thereon, which in turn may appropriately determine the work function for a transistor to be formed in and above the active region 202A. In the embodiment shown, it may be assumed that the active region 202A may represent a P-channel transistor, while the active region 202B may represent an N-channel transistor. It should be appreciated, however, that any other configuration is contemplated in the present disclosure. For example, the material 202C, which may also be referred to as a threshold adjusting semiconductor material, may be provided in the form of a silicon/germanium alloy with a thickness of several nanometers and with a germanium concentration of approximately 10-20 atomic percent. Furthermore, in the manufacturing stage shown, a gate layer stack 260S may be formed above the active regions 202A, 202B and may comprise a gate dielectric material 261, which in some illustrative embodiments may comprise a high-k dielectric material, as discussed above. Furthermore, a semiconductor-based electrode material 263, for instance in the form of silicon or silicon/germanium, may be provided above the gate dielectric material 261. Furthermore, in some illustrative embodiments, an additional electrode material or conductive cap material may be provided between the gate dielectric material 261 and the semiconductor material 263. For instance, a first conductive cap material 262A may be provided above the active region 202A, while a second conductive cap material 262B may be formed above the active region 202B. The materials 262A and 262B differ in their composition so as to enable the adjustment of appropriate work function values for gate electrode structures to be formed from the gate layer stack 260S.

The semiconductor device 200 as illustrated in FIG. 2a may be formed on the basis of any appropriate process strategy. For instance, the active regions 202A, 202B may be formed on the basis of well-established process techniques, wherein the material 202C, if required, may be formed on the basis of epitaxial growth techniques, during which the active region 202B may be masked or wherein the material 202C may otherwise be removed from the active region 202B. Next, the material 261 and, if required, the materials 262A, 262B may be formed by surface treatment, deposition and the like, possibly in combination with additional patterning processes so as to provide the desired difference in the material systems 262A, 262B, if required. Thereafter, the layer 263 may be deposited, for instance, in the form of silicon and the like in accordance with well-established process recipes. In some illustrative embodiments, a modification process 206 may be performed on the basis of the layer stack 260S, as shown in FIG. 2a, prior to providing additional material layers, such as a dielectric cap layer and the like. In some illustrative embodiments, the modification process 206 may be applied selectively above the active region 202A, which is to receive a strain-inducing semiconductor material in a later manufacturing stage. In other cases, if a corresponding local modification of the material 263 for both types of transistors is considered appropriate, the process 206 may be applied without masking the material 263 above the active region 202B. In some illustrative embodiments, the process 206 may be performed as an ion implantation process based on an appropriate implantation species, such as a dopant species, an electrically inert species, such as xenon, and the like, which may thus result in a significant modification of the etch and/or oxidation behavior of the material 263. For this purpose, an appropriate implantation energy may be selected in view of the characteristic of the material 263 and the implantation species selected in order to obtain a modified portion 263T, which may have an average thickness of several nanometers, such as 10 nm and less. It should be appreciated that appropriate process parameters, such as implantation energy, may be readily determined on the basis of well-established simulation programs, experiments and the like. In other cases, the process 206 may represent an electron bombardment, wherein an appropriate electron energy may be selected to provide a significant modification of the surface characteristics of the material 263. For this purpose, any appropriate process tools may be used in which an electron beam with an energy of several KeV to several tenths of KeV may be generated.

After the process 206, the further processing may be continued, for instance, by the deposition of further materials, such as a dielectric cap layer, hard mask materials and the like. In some illustrative embodiments (not shown), the modification process 206 may be performed in the presence of one of these layers, for instance, by adjusting the implantation energy when a corresponding scattering effect of the underlying layer is considered appropriate.

Figure 2B:
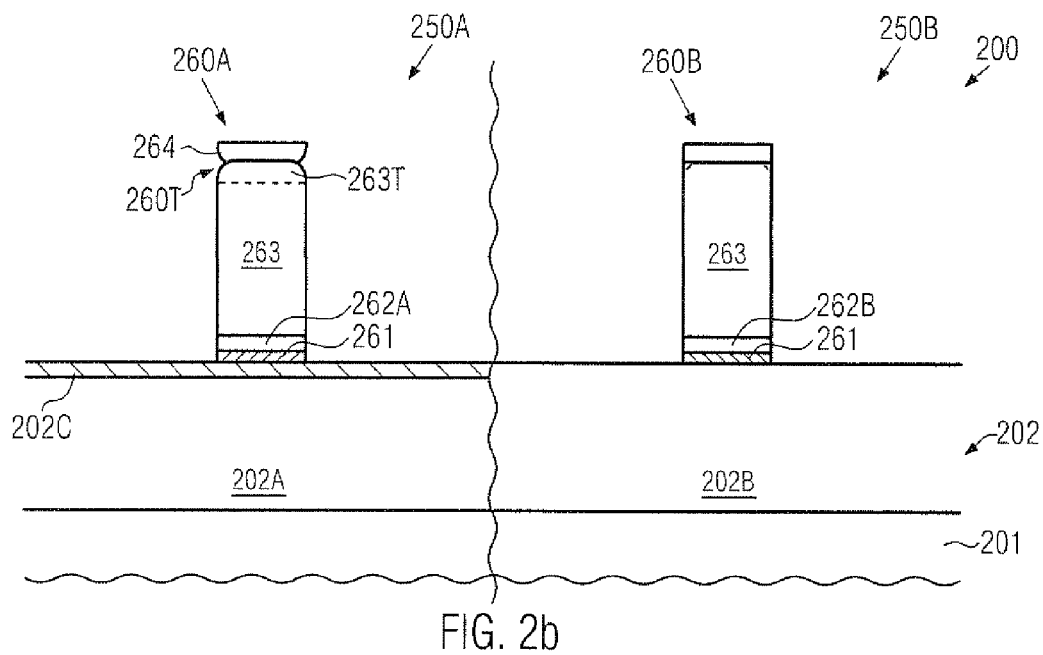

FIG. 2b schematically illustrates the semiconductor device 200 in a further advanced manufacturing stage. As shown, gate electrode structures 260A, 260B are formed above the active regions 202A, 202B, respectively. At least the gate electrode structure 260A may comprise a "rounded" area 260T at the top of the semiconductor material 263. Furthermore, a dielectric cap layer 264 may be formed above the material 263, i.e., the modified portion 263T. The gate electrode structure 260B may or may not have a rounded upper portion of the material 263, depending on whether or not the modified material portion 260T has also been formed in the electrode material 263 above the active region 202B.

The device 200 as illustrated in FIG. 2b may be formed on the basis of any appropriate patterning strategy, including sophisticated lithography processes in combination with processes as also, for instance, described with reference to the device 100. During the corresponding patterning process, for instance after etching through the dielectric cap layer 264, the semiconductor-based material 263 may be etched by using any appropriate chlorine-based or hydrogen bromide-based etch chemistry. During the etch process, the material 263T may have a different, i.e., higher, etch rate, wherein a certain horizontal etch component may also occur, thereby resulting in a certain degree of corner rounding, as indicated by 260T. Generally, the rounded shape at the top 260T of the material 263 may be advantageous during the further processing, for instance when forming an oxide liner in combination with a sidewall spacer, thereby enhancing integrity of the area 260T during a process sequence for forming a strain-inducing semiconductor material in the active region 202A. It should be appreciated that, as previously discussed, in some illustrative embodiments, the work function of the gate electrode structures 260A, 260B may already be adjusted by applying the material systems 262A, 262B in combination with a high-k material in the gate dielectric material 261.

With reference to FIGS. 2c-2f, further illustrative embodiments will now be described in which a certain degree of corner rounding of the semiconductor material 263 may be accomplished after patterning the gate electrode structures.

Figure 2C:
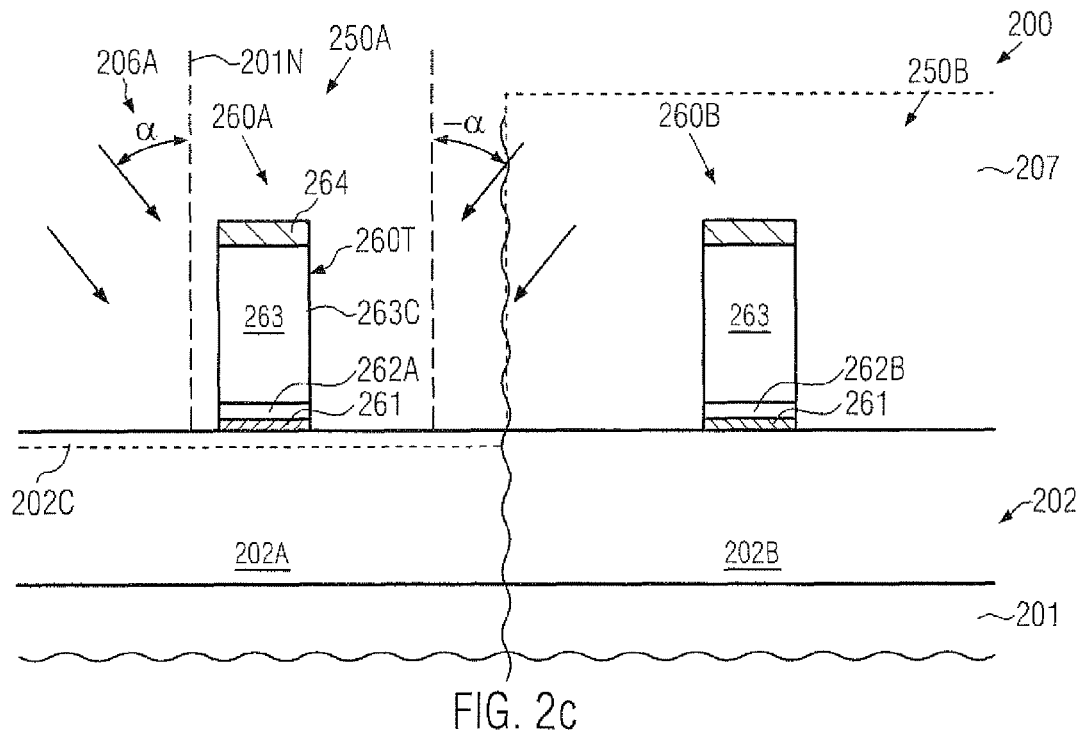
FIGS. 2c-2f schematically illustrate cross-sectional views of the semiconductor device during various manufacturing stages for locally modifying an oxidation rate of a semiconductor-based electrode material after the patterning of the gate electrode structures, according to illustrative embodiments.

FIG. 2c schematically illustrates the semiconductor device 200 with the gate electrode structures 260A, 260B formed above the active regions 202A, 202B, respectively. The gate electrode structures 260A, 260B may have a shape and configuration as may also be obtained on the basis of conventional patterning strategies. As previously discussed, the gate electrode structures may, in some illustrative embodiments, represent sophisticated material systems including high-k dielectric materials in combination with conductive cap materials, such as the layers 262A, 262B, while, in other cases, sophisticated gate electrode structures without the conductive cap materials and without high-k materials may be used. Furthermore, the device 200 may be treated by a modification process 206A, which may include an implantation process and/or an electron beam, wherein a tilt angle $\alpha$ may be used so as to locally introduce an implantation species or create an otherwise modified portion 263C. It should be appreciated that the tilt angle $\alpha$ is to be understood as an angle of direction of incidence of a substantially parallel ion beam or electron beam and a surface normal 201N, as illustrated. In order to obtain the modified portion 263C on both sides of the gate electrode structure 260A, the treatment 206A may be performed on the basis of tilt angles $\alpha$ and $-\alpha$. For example, a tilt angle of approximately 50-70° may be appropriate so as to obtain the modified portion 263C. In some illustrative embodiments, an implantation mask 207 may be provided to cover the gate electrode structure 260B when a corresponding modification therein is not desired. Furthermore, the implantation mask 207 may result in combination with an appropriately selected tilt angle in a very localized modification of the material 263, i.e., preferably at the corner areas 260T of the material 263, since any lower portions of the gate electrode structure 260A, as well as the active region 202A, may be "shadowed" by the mask 207. It should be appreciated that a corresponding mask may also be provided at the left hand side in FIG. 2c (not shown).

Figure 2D:
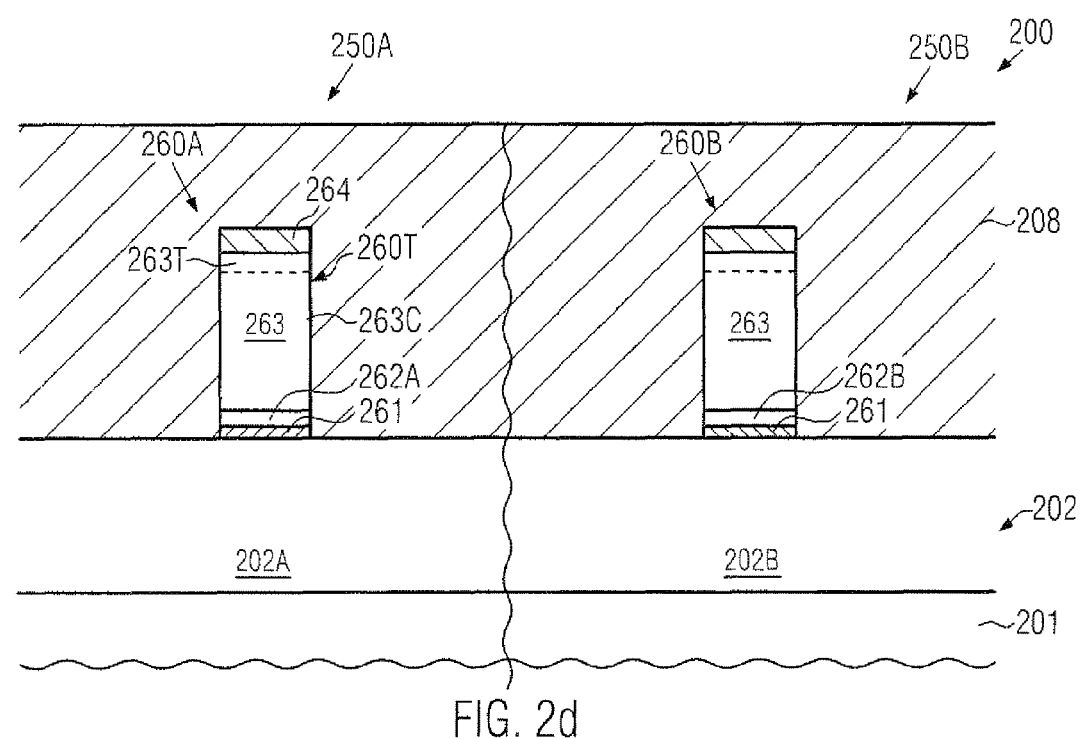

FIG. 2d schematically illustrates the device 200 according to still further illustrative embodiments in which a fill material 208, such as an organic planarization material and the like, may be formed so as to enclose the gate electrode structures 260A, 260B. Based on the material 208, an implantation process may be performed so as to incorporate any appropriate implantation species, thereby forming a modified portion 263T. Providing the planarization material 208 may be advantageous so as to avoid the incorporation of implantation species in the active region 202B, which may thus otherwise negatively affect the electronic characteristics thereof. In other illustrative embodiments, a portion of the planarization material 208 may be removed on the basis of any appropriate etch process, possibly in combination with a polishing process so as to expose an upper portion of the gate electrode structures 260A, 260B, prior to incorporating appropriate implantation species or exposing the gate electrode structures 260A, 260B to an electron beam.

Figure 2E:
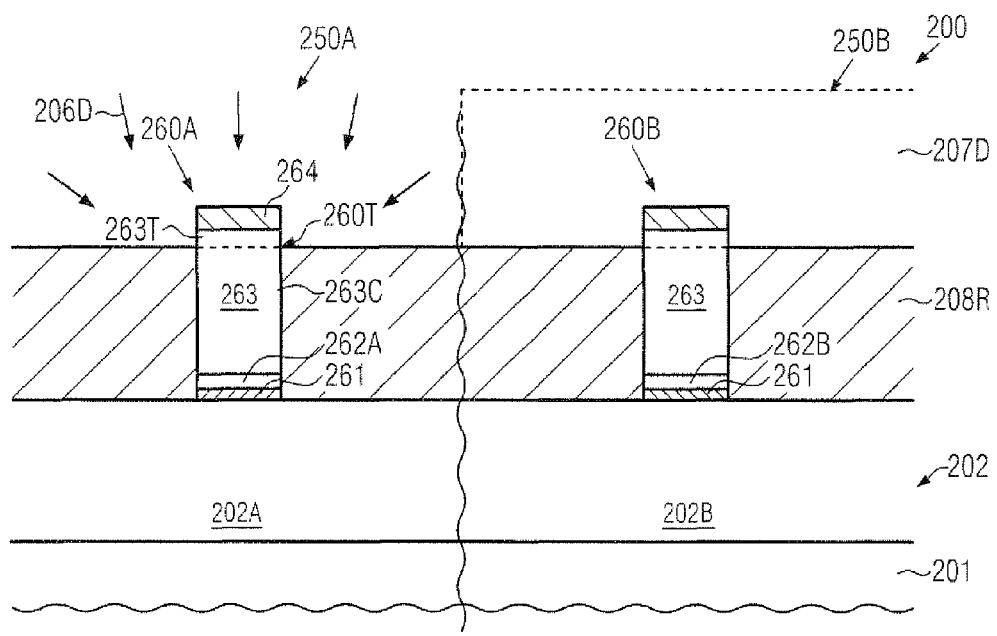

FIG. 2e schematically illustrates the semiconductor device 200 with the planarization material 208R having a reduced thickness, thereby exposing an upper portion of the gate electrode structures 260A, 260B. Consequently, the device 200 may be exposed to a treatment 206D, such as an implantation process, an electron beam treatment and the like, in order to obtain the modified portion 263T without affecting the active regions 202A, 202B and without affecting the remaining material 263 in the gate electrode structures. For example, the treatment 206D may include an implantation process or an electron beam treatment with a non-zero tilt angle, thereby even further locally restricting the modified portion 263T to the upper corner areas 260T of the material 263, if desired. In other illustrative embodiments, a mask 207D may be provided above the active region 202B, when a modification of the gate electrode structure 260B is considered inappropriate.

Figure 2F:
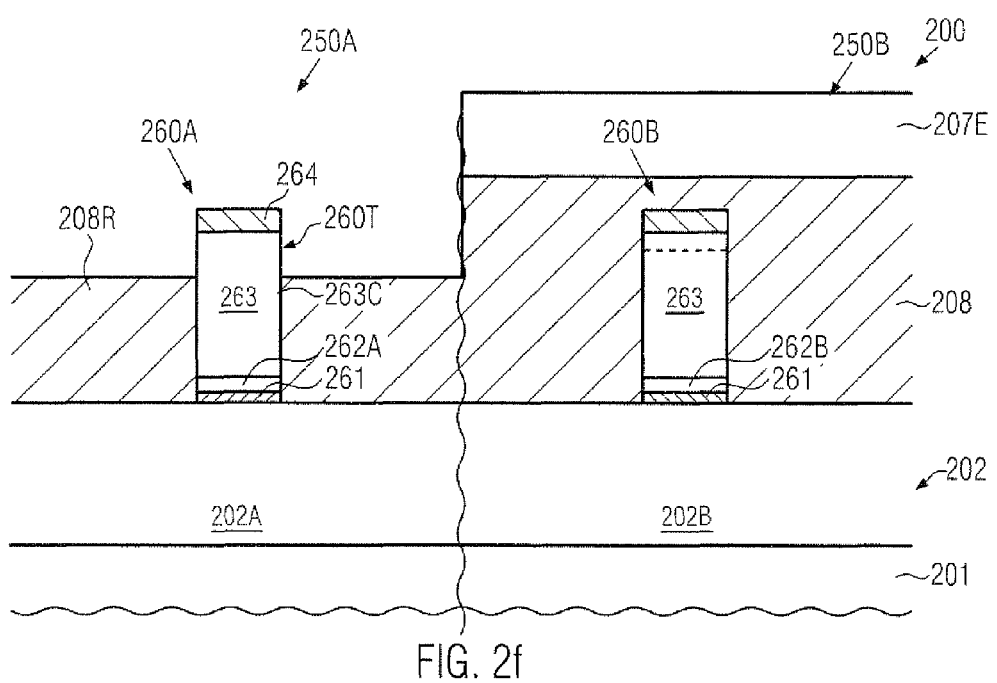

FIG. 2f schematically illustrates the semiconductor device 200 according to further illustrative embodiments in which a mask 207E may be provided to pattern the planarization material 208 so as to form the reduced portion 208R selectively above the active region 202A. Consequently, the gate electrode structure 260B may remain substantially unaffected by the subsequent treatment of the upper area 260T of the gate electrode structure 260A, while, additionally, any influence or treatment on the active region 202A and the lower portion of the material 263 may be suppressed. This may be considered appropriate so as to restrict the modification of an oxidation rate of the material 263 to the upper portion 260T, while the remaining portion of the material 263 as well as the active region 202A may have the initial oxidation behavior.

Figure 2G:
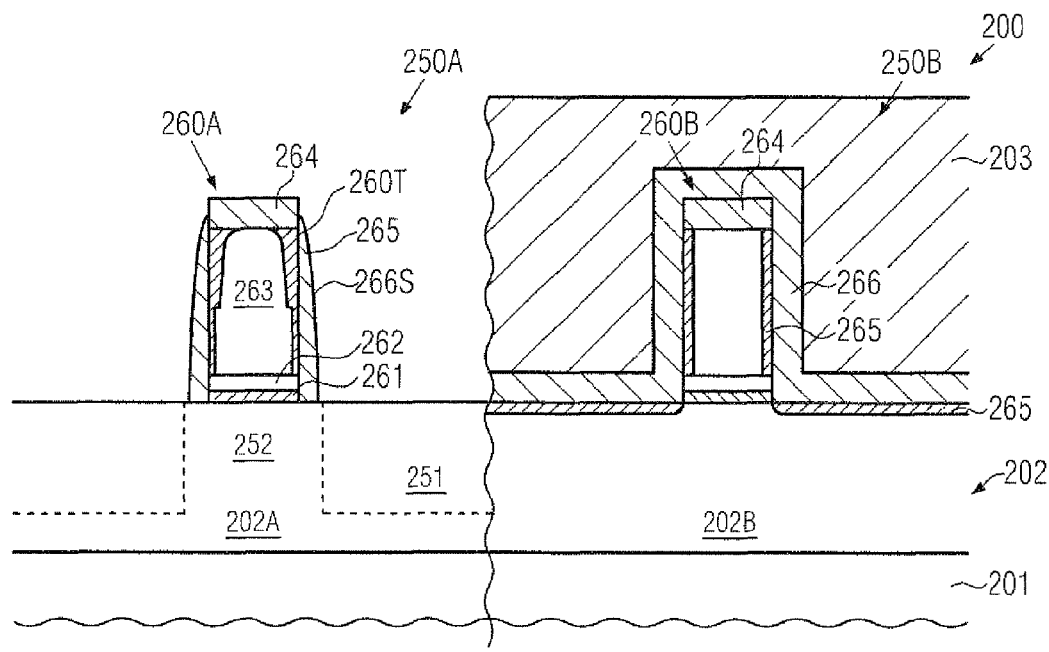
FIGS. 2g-2h schematically illustrate cross-sectional views of the semiconductor device in advanced manufacturing stages in which a strain-inducing semiconductor alloy may be incorporated on the basis of spacer elements of reduced thickness, according to still further illustrative embodiments.

FIG. 2g schematically illustrates the semiconductor device 200 in a further advanced manufacturing stage. As illustrated, the gate electrode structure 260A may comprise an oxide liner 265, which may have an increased thickness at least in the upper portion 260T, thereby imparting to the semiconductor material 263 a rounded shape. Furthermore, a spacer element 266S, such as a silicon nitride spacer and the like, may be formed on the oxide liner 265 and may have a thickness of approximately 8 nm and less, such as 5 nm and less, which may be acceptable due to the superior integrity of the material 263 in the upper portion 260T due to the presence of the liner 265 having the increased thickness. In other cases, the spacer element 266S may also have an increased thickness at the area 260T due to a generally rounded shape of the material 263, as is, for instance, explained with reference to FIG. 2b.

On the other hand, the gate electrode structure 260B may have formed on sidewalls thereof the oxide liner 265, while a spacer layer 266 may cover the active region 202B and the gate electrode structure 260B. As previously explained, the spacer layer 266 may be provided with a reduced thickness, such as approximately 8 nm and less, in order to obtain the spacer element 266S with a reduced width, thereby providing a reduced offset of cavities 251 from a channel region 252 of the active region 202A, as is also previously explained.

Consequently, upon etching the cavities 251, possibly in the presence of the resist mask 203, which is used for patterning the spacer layer 266, as is also previously discussed with reference to the device 100, any cleaning processes may be performed in order to prepare the device 200 for the subsequent selective epitaxial growth process. Thus, due to the superior shape (FIG. 2b) and/or due to the rounding of the material 263 with respect to the oxide liner 265, the probability of exposing a portion of the material 263 may be significantly reduced compared to the conventional approaches, even if a reduced thickness of the spacer element 266S is used. Consequently, during the subsequent selective epitaxial growth process, a reduced offset of the strain-inducing material with respect to the channel region 252 may be accomplished, while also suppressing the generation of any material residues at the top area 260T.

Figure 2H:
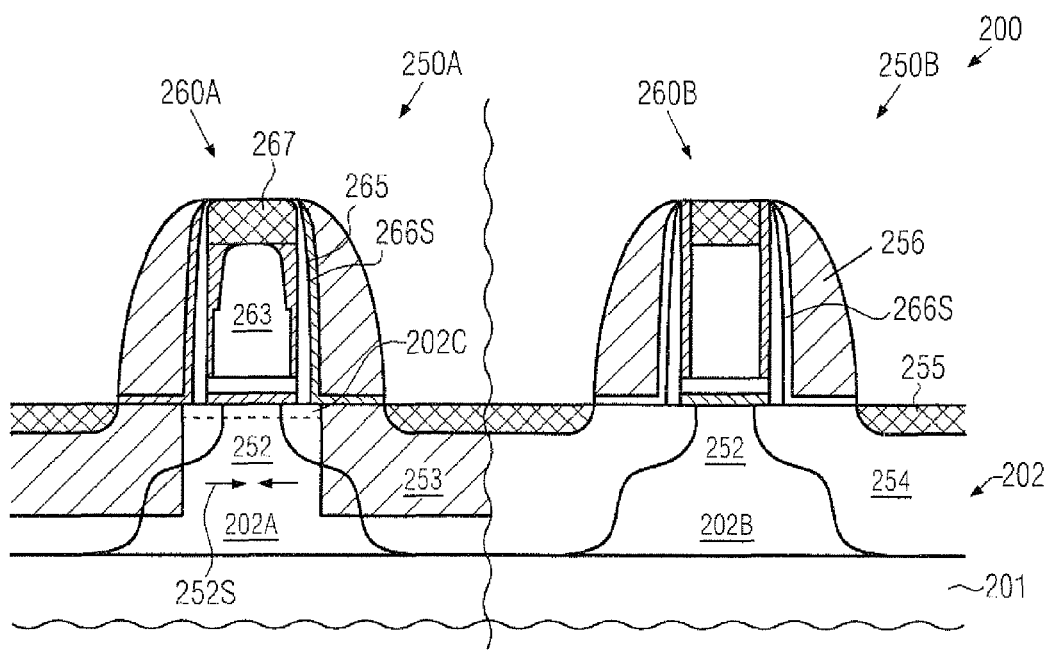

FIG. 2h schematically illustrates the semiconductor device 200 in a further advanced manufacturing stage. As shown, the transistors 250A, 250B may comprise drain and source regions 254 in combination with metal silicide regions 255. Moreover, the transistor 250A may comprise the strain-inducing semiconductor alloy 253, such as a silicon/germanium alloy and the like, thereby creating a desired strain component 252S in the channel region 252. Due to the reduced width of the spacer element 266S of approximately 5 nm and less, a significant increase of the strain component 252S compared to conventional strategies may be achieved.

The gate electrode structures 260A, 260B may also comprise metal silicide regions 267, which may be provided without any undue irregularities, which may conventionally be caused by the presence of any semiconductor residues, as discussed with reference to the device 100. Moreover, a sidewall spacer structure 256 may be formed on sidewalls of the gate electrode structures and may comprise any appropriate configuration, for instance in the form of one or more spacer elements in combination with etch stop liners and the like.

The device 200 as illustrated in FIG. 2h may be formed on the basis of any appropriate process technique, i.e., after incorporating the strain-inducing semiconductor material 253, the spacer 266S may also be formed on the gate electrode structure 260B from the spacer layer 266 (FIG. 2g), while, in other approaches, the spacer 266S, the spacer layer 266 and the conductive cap layer 264 (FIG. 2g) may be removed. Thereafter, the spacers 266S, if preserved, or any offset spacer elements may be used for forming drain and source extension regions and thereafter the sidewall spacer structure 256 may be formed on the basis of well-established techniques. The structure 256 may then be used for forming the drain and source regions 254 by ion implantation and subsequent anneal processes, followed by the formation of the metal silicide regions 255 and 267 in accordance with any appropriate process technique.

As a result, the present disclosure provides semiconductor devices and manufacturing techniques in which a thin sidewall spacer structure may be provided prior to the incorporation of a strain-inducing semiconductor alloy, wherein integrity of a semiconductor material at a top area of the gate electrode structure may be increased by creating a certain degree of corner rounding of the semiconductor material. For this purpose, the etch behavior and/or the oxidation behavior of at least the upper portion of the semiconductor material may be modified, for instance, by ion implantation, thereby obtaining the superior configuration, which may thus significantly reduce the risk of creating undesired semiconductor residues upon epitaxially growing the strain-inducing semiconductor material in the active region. Consequently, highly sophisticated gate electrode structures, for instance on the basis of a high-k dielectric material in combination with a conductive cap material, may be provided in an early manufacturing stage without interference of any semiconductor residues during the further processing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
forming a gate electrode structure above a semiconductor region, said gate electrode structure comprising a gate dielectric material, a semiconductor material formed above said gate dielectric material and a dielectric cap material formed above said semiconductor material;
performing an oxidation process to form an oxide liner an sidewalls of said semiconductor material, a thickness of said oxide liner being greatest at an interface formed by said semiconductor material and said dielectric cap layer;

forming a spacer on sidewalls of said gate electrode structure;

forming cavities in said semiconductor region by using said dielectric cap layer and said spacer as an etch mask; and forming a strain-inducing semiconductor material in said cavities by using said dielectric cap layer and said spacer as a growth mask.

2. The method of claim 1, wherein said spacer is formed by depositing a spacer layer having a thickness of approximately 8 nm or less.

3. The method of claim 2, wherein said spacer layer is deposited with a thickness of approximately 5 nm or less.

4. The method of claim 1, wherein forming said gate electrode structure comprises incorporating an implantation species locally in said semiconductor material so as to locally increase an oxidation rate of said semiconductor material.

5. The method of claim 4, wherein incorporating said implantation species comprises forming a layer of said semiconductor material and introducing said implantation species prior to patterning said layer of said semiconductor material.

6. The method of claim 4, wherein incorporating said implantation species comprises performing an implantation process using a non-zero tilt angle after forming said gate electrode structure.

7. The method of claim 4, wherein incorporating said implantation species comprises forming a mask material above said semiconductor region and laterally adjacent to said gate electrode structure and performing an implantation process in the presence of said mask material.

8. The method of claim 1, wherein said strain-inducing semiconductor material induces a compressive strain.

9. The method of claim 1, wherein forming said gate electrode structure comprises providing a high-k dielectric material in said gate dielectric material and providing a work function adjusting species above said high-k dielectric material.

10. A method, comprising:

forming a gate layer stack above a first semiconductor region and a second semiconductor region;

patterning said gate layer stack to form a first gate electrode structure above said first semiconductor region and a second gate electrode structure above said second semiconductor region, said first and second gate electrode structures comprising a semiconductor material;

modifying an oxidation behavior of the semiconductor material of said first gate electrode structure;

performing an oxidation process to form an oxide on sidewalls of said semiconductor material of said first and second gate electrode structures;

forming a spacer layer above said first and second gate electrode structures;

forming a spacer element on said sidewalls of said first gate electrode structure on the basis of said spacer layer; and forming a strain-inducing semiconductor alloy in said first semiconductor region by using said spacer element as a mask.

11. The method of claim 10, wherein modifying said oxidation behavior comprises performing an implantation process to incorporate an implantation species with an average penetration depth of approximately 5 nm or less.

12. The method of claim 11, wherein performing said implantation process comprises applying a non-zero tilt angle.

13. The method of claim 10, wherein modifying said oxidation behavior comprises performing an electron bombardment.

14. The method of claim 10, wherein forming said gate layer stack comprises forming a high-k dielectric material above said first and second semiconductor regions and forming a metal-containing cap layer above said high-k dielectric material.

15. The method of claim 10, further comprising forming drain and source regions in said first and second semiconductor regions to form a P-channel transistor based on said first semiconductor region and an N-channel transistor based on said second semiconductor region.

16. The method of claim 10, further comprising forming a metal silicide in said semiconductor material of said first and second gate electrode structures.

17. The method of claim 10, wherein said spacer layer is formed with a thickness of approximately 8 nm or less.

18. The method of claim 10, further comprising forming a threshold adjusting semiconductor material selectively on said first semiconductor region prior to forming said first and second gate electrode structures.

19. A semiconductor device, comprising:

a gate electrode structure of a transistor formed above a semiconductor region and comprising a silicon-containing electrode material formed above a gate insulation layer comprising a high-k dielectric material, said silicon-containing electrode material having sidewalls, said gate electrode structure further comprising a silicon oxide material formed on said sidewalls, said silicon oxide material having thickness at a top of said silicon-containing electrode material that is greater than a thickness at a bottom of said silicon-containing electrode material;

a strain-inducing semiconductor alloy formed in said semiconductor region; and drain and source regions at least partially formed in said strain-inducing semiconductor alloy.

20. The semiconductor device of claim 19, wherein said silicon-containing electrode material comprises a metal silicide.

* * * * *